(12) United States Patent
Oh et al.

(10) Patent No.: US 12,538,842 B2
(45) Date of Patent: Jan. 27, 2026

(54) THREE-DIMENSIONAL STORAGE DEVICE USING WAFER-TO-WAFER BONDING

(71) Applicant: SAMSUNG ELECTRONICS CO., LTD., Suwon-si (KR)

(72) Inventors: Eun Chu Oh, Hwaseong-si (KR); Byungchul Jang, Suwon-si (KR); Junyeong Seok, Seoul (KR); Younggul Song, Hwaseong-si (KR); Joonsung Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 819 days.

(21) Appl. No.: 17/848,844

(22) Filed: Jun. 24, 2022

(65) Prior Publication Data

US 2023/0038363 A1 Feb. 9, 2023

(30) Foreign Application Priority Data

Aug. 4, 2021 (KR) ........................ 10-2021-0102666

(51) Int. Cl.
*H01L 25/065* (2023.01)
*H01L 23/00* (2006.01)
*H01L 25/18* (2023.01)

(52) U.S. Cl.
CPC .......... *H01L 24/08* (2013.01); *H01L 25/0657* (2013.01); *H01L 25/18* (2013.01);
(Continued)

(58) Field of Classification Search
CPC ..... H01L 24/08; H01L 25/0657; H01L 25/18; H01L 2224/08145; H01L 2924/1431;
(Continued)

(56) References Cited

U.S. PATENT DOCUMENTS 9,406,711 B2 8/2016 Chen et al.
10,002,836 B2 6/2018 Spitzlsperger et al.
(Continued)

FOREIGN PATENT DOCUMENTS

KR 10-2020-0037895 A 4/2020
KR 10-2021-0027706 A 3/2021

OTHER PUBLICATIONS

Communication issued Apr. 22, 2025 by the Korean Intellectual Property Office in counterpart Korean Patent Application No. 10-2021-0102666.

*Primary Examiner* — Thanh Y. Tran
(74) *Attorney, Agent, or Firm* — Sughrue Mion, PLLC

(57) ABSTRACT

Provided is a three-dimensional storage device using wafer-to-wafer bonding. A storage device includes a first chip including a first substrate and a peripheral circuit region including a first control logic circuit configured to control operation modes of the non-volatile memory device and a second chip including a second substrate and three-dimensional arrays of non-volatile memory cells. The second chip may be vertically stacked on the first chip so that a first surface of the first substrate faces a first surface of the second substrate, and a second control logic circuit is configured to control operation conditions of the non-volatile memory device and is arranged on a second surface of the second substrate, the second surface of the second substrate being opposite to the first surface of the second substrate of the second chip.

19 Claims, 13 Drawing Sheets

(52) U.S. Cl.
CPC ............... *H01L 2224/08145* (2013.01); *H01L 2924/1431* (2013.01); *H01L 2924/14511* (2013.01)

(58) Field of Classification Search
CPC . H01L 2924/14511; H01L 2225/06541; H01L 25/16; H10B 43/40
See application file for complete search history.

(56) References Cited

U.S. PATENT DOCUMENTS

| | | |
|---|---|---|
| 10,354,987 B1 | 7/2019 | Mushiga et al. |
| 10,510,415 B1 | 12/2019 | Huo et al. |
| 10,510,738 B2 | 12/2019 | Kim et al. |
| 10,748,886 B2 | 8/2020 | Park et al. |
| 10,903,164 B2 | 1/2021 | Nishida |
| 10,937,766 B2 | 3/2021 | Liu |
| 10,957,680 B2 | 3/2021 | Yada et al. |
| 11,120,843 B2 | 9/2021 | Park et al. |
| 2021/0118988 A1 | 4/2021 | Gan et al. |
| 2021/0134778 A1 | 5/2021 | Huang et al. |
| 2022/0115344 A1* | 4/2022 | Kim ........................ H01L 24/80 |
| 2022/0130846 A1 | 4/2022 | Kim et al. |

* cited by examiner

THREE-DIMENSIONAL STORAGE DEVICE USING WAFER-TO-WAFER BONDING

CROSS-REFERENCE TO RELATED APPLICATION

This application is based on and claims priority under 35 U.S.C. § 119 to Korean Patent Application No. 10-2021-0102666, filed on Aug. 4, 2021 in the Korean Intellectual Property Office, the disclosure of which is incorporated by reference herein in its entirety.

BACKGROUND

The inventive concept relates to a semiconductor device, and more particularly, to a three-dimensional (3D) storage device using wafer-to-wafer bonding.

To store data or instructions used by a host in a system and/or to perform a computational operation, the system including semiconductor chips widely uses dynamic random access memory (DRAM) as an operation memory or a main memory of the system, and uses a storage device as a storage medium. The storage device may include a non-volatile memory. As a capacity of the storage device is increased, the number of memory cells and word lines stacked on a substrate of the non-volatile memory is increased, and the number of bits of data stored in the memory cell is also increased. To improve a memory capacity and a degree of integration of a memory, research into a non-volatile memory device, in which there are stacks of memory cells having a 3D structure, for example, 3D NAND flash memory, is under development. More specifically, there has been an increasing demand for research on a storage device capable of stably performing real time processing and processing a large amount of fast data by using the 3D NAND flash memory.

SUMMARY

The inventive concept provides a three-dimensional storage device using wafer-to-wafer bonding.

According to an embodiment, there is provided a non-volatile memory device including: a first chip including a first substrate and a peripheral circuit region including a first control logic circuit configured to control operation modes of the non-volatile memory device, wherein the peripheral circuit region is arranged on a first surface of the first substrate of the first chip; and a second chip including a second substrate and three-dimensional arrays of non-volatile memory cells, wherein the three-dimensional arrays are arranged on a first surface of the second substrate of the second chip, the second chip being vertically stacked on the first chip so that the first surface of the first substrate faces the first surface of the second substrate, wherein a second control logic circuit is configured to control operation conditions of the non-volatile memory device and is arranged on a second surface of the second substrate, the second surface of the second substrate being opposite to the first surface of the second substrate of the second chip.

According to an embodiment, there is provided a storage device including: a non-volatile memory device including non-volatile memory cells; and a memory controller configured to control the non-volatile memory device. The non-volatile memory device includes: a first chip including a first substrate and a peripheral circuit region including a first control logic circuit configured to control operation modes of the non-volatile memory device, wherein the peripheral circuit region is arranged on a first surface of the first substrate of the first chip; and a second chip including a second substrate and three-dimensional arrays of the non-volatile memory cells, wherein the three-dimensional arrays are arranged on a first surface of the second substrate of the second chip, the second chip being vertically stacked on the first chip so that the first surface of the first substrate faces the first surface of the second substrate. The memory controller includes: a third chip including a third substrate and a control circuit region including first circuits configured to set and change operation conditions for the non-volatile memory device, wherein the control circuit region is arranged on a first surface of the third substrate of the third chip, and a second control logic circuit is configured to control the operation conditions of the non-volatile memory device and is arranged on a second surface of the second substrate, the second surface of the second substrate being opposite to the first surface of the second substrate of the second chip.

According to an embodiment, there is provided a storage device including: a non-volatile memory device including non-volatile memory cells; and a memory controller configured to control the non-volatile memory device. The non-volatile memory device includes: a first chip including a first substrate and a peripheral circuit region including a first control logic circuit configured to control operation modes of the non-volatile memory device, wherein the peripheral circuit region is arranged on a first surface of the first substrate; and a second chip including a second substrate and three-dimensional arrays of the non-volatile memory cells, wherein the three-dimensional arrays are arranged on a first surface of the second substrate of the second chip, the second chip being vertically stacked on the first chip so that the first surface of the first substrate faces the first surface of the second substrate, wherein a control circuit region including at least one of circuits constituting the memory controller is formed on a second surface of the second substrate, the second surface of the second substrate being opposite to the first surface of the second substrate of the second chip.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
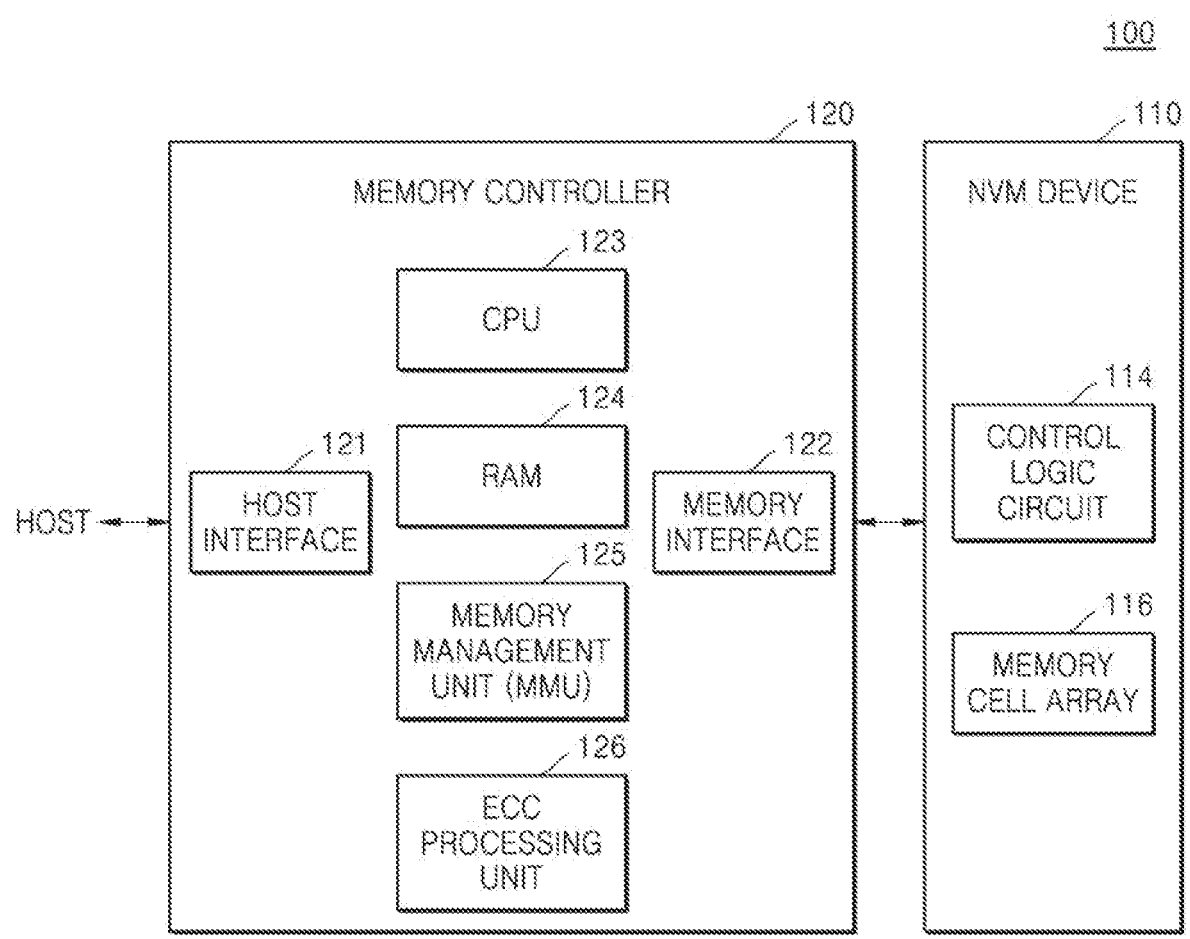
FIG. 1 is a block diagram of a storage device according to an embodiment.

FIG. 1 is a block diagram of a storage device 100 according to an embodiment.

Referring to FIG. 1, the storage device 100 may include a memory device 110 and a memory controller 120. In the present embodiment, a plurality of schematic hardware components included in the storage device 100 are illustrated, but the embodiment is not limited thereto, and other configurations may be possible. The memory controller 120 may control the memory device 110 to write data thereto in response to a write request from a host, or may control the memory device 110 to read data stored therein in response to a read request from the host.

In some embodiments, the storage device 100 may include an internal memory embedded in an electronic device. For example, the storage device 100 may include an embedded universal flash storage (UFS) memory device, an embedded multi-media card (eMMC), or a solid state drive (SSD). In some embodiments, the storage device 100 may include an external memory removable from the electronic device. For example, the storage device 100 may include at least one of a universal flash storage (UFS) memory card, a compact flash (CF) card, a secure digital (SD) card, a micro-SD card, a mini-SD card, an extreme digital (xD) card, and a memory stick.

The memory device 110 may perform a write operation, a read operation, or the like, according the control of the memory controller 120. The memory device 110 may receive a command and an address from the memory controller 120 via input/output lines, and transmit data for a write operation and/or receive data for a read operation to and from the memory controller 120. In addition, the memory device 110 may receive control signals via control lines. The memory device 110 may include a control logic circuit 114 and a memory cell array 116.

The control logic circuit 114 may generally control various operations of the memory device 110. The control logic circuit 114 may receive a command and an address from the memory controller 120, and may generate the control signals for controlling components of the memory device 110 according to the received command/address. For example, the control logic circuit 114 may store data in the memory cell array 116 by using control signals, or may read data stored in the memory cell array 116 and output the read data to the memory controller 120.

The memory cell array 116 may include a plurality of memory cells. For example, the plurality of memory cells may include flash memory cells. However, the embodiment is not limited thereto, and the memory cells may include a resistive random access memory (RAM) (RRAM) cell, a ferroelectric RAM (FRAM) cell, a phase change RAM (PRAM) cell, a thyristor RAM (TRAM) cell, and a magnetic RAM (MRAM). Hereinafter, embodiments of the inventive concept are described mainly on an embodiment in which the memory cells include NAND flash memory cells. Accordingly, the memory device 110 may be referred to as a non-volatile memory (NVM) device.

The memory cell array 116 may include a first memory block BLK1 to a $z^{th}$ memory block BLKz (where, z is an integer greater than or equal to 2), and each of the first memory block BLK1 through the $z^{th}$ memory block BLKz may include a plurality of pages. The memory cell array 116 may include a three-dimensional (3D) memory cell array including a plurality of cell strings, and descriptions thereof are provided in more detail with reference to FIGS. 3 and 4.

The memory controller 120 may include a host interface 121, a memory interface 122, a central processing unit (CPU) 123, a RAM 124, a memory management unit (MMU) 125, and an error correction code (ECC) processing unit 126.

The host interface 121 may receive a request for a memory operation from the host. For example, the host interface 121 may receive various requests for reading and/or writing data from the host, and in response thereto, the host interface 121 may generate various internal signals for the memory operation of the NVM device 110. For example, the host interface 121 may be configured to communicate with the host via at least one of various interface protocols such as advanced technology attachment (ATA), serial ATA (SATA), external SATA (e-SATA), small computer system interface (SCSI), serial attached SCSI (SAS), peripheral component interconnect (PCI), PCI express (PCI-E), IEEE 1394, universal serial bus (USB), a secure digital (SD) card, a multi-media card (MMC), an embedded multi-media card (eMMC), and a compact flash (CF) card.

The memory interface 122 may provide an interface between the memory controller 120 and the NVM device 110, and for example, write data and read data may be transmitted to and received from the NVM device 110 via the memory interface 122. In addition, the memory interface 122 may provide a command and an address to the NVM device 110, and may receive various pieces of information from the NVM device 110 and provide the pieces of information to the memory controller 120.

The CPU 123 may be configured to control an overall operation of the memory controller 120, and the RAM 124 may be used as a working memory. The CPU 123 may control an overall operation of the memory controller 120 by executing firmware loaded in the RAM 124. The RAM 124 may be implemented as various memories, and for example, as at least one of cache memory, dynamic RAM (DRAM), static RAM (SRAM), PRAM, and a flash memory device. Hereinafter, the RAM 124 is described mainly on an embodiment including SRAM.

The CPU 123 may be configured to utilize firmware such as a flash translation layer (FTL) stored in the MMU 125. The MMU 125 may be executed by the CPU 123 for controlling or managing the performance and reliability of the NVM device 110, and may store upgradable code. The FTL may be used to manage mapping information representing a relationship between a logical address of the host and a physical address of the NVM device 110. However, a role of the FTL is not limited thereto. For example, the FTL may be used to control data preservation management or the like due to wear-leveling management, bad block management, and unexpected power cutoff of the NVM device 110.

To support various functions of the FTL, the MMU 125 may, based on a deterioration state of the NVM device 110, include an artificial neural network storing program code, which infers operation conditions for accessing each of the first memory block BLK1 through the $z^{th}$ memory block BLKz. The NVM device 110 may be deteriorated by various causes according to a usage pattern, a usage environment, or the like of a user. The MMU 125 may store deterioration information of the NVM device 110. The deterioration information may include a program/erase (P/E) cycle, an erase count, a program count, a read count, a wear level count, an elapse time, an operation temperature, etc.

The MMU 125 may address deterioration by changing operation conditions of the NVM device 110 by using an artificial neural network model. For example, operation conditions to be changed by the MMU 125 may be set in advance in the storage device 100 based on an average usage pattern and a usage environment. In addition, the MMU 125 may change operation conditions according to a deterioration level by monitoring a deterioration status of the NVM device 110. The MMU 125 may include a deep learning machine specialized in executing or learning the artificial neural network model.

As an example, the MMU 125 may, based on the deterioration information, generate training data including optimum read levels (VR1-VR15 or VR1'-VR15' in FIG. 5) to be applied to each of the first memory block BLK1 through the $z^{th}$ memory block BLKz of the NVM device 110, and store the generated training data in the RAM 124. The CPU 123 may update weights and biases of the artificial neural network model based on the training data. The weights and biases of the artificial neural network model may be updated according to various deterioration conditions, for example, retention times, the number of reads, or various combinations of retentions times and the number of reads. The artificial neural network model may receive input data of the training data, and may repeatedly output the optimum read levels (VR1-VR15 or VR1'-VR15'). Thereafter, the storage device 100 may read data by applying the optimum read levels (VR1-VR15 or VR1'-VR15') to a target word line of the NVM device 110 corresponding to a request from the host.

The ECC processing unit 126 may perform ECC encoding and decoding on data requested to be written in the NVM device 110 and data read from the NVM device 110, and may detect and correct errors in the data. The ECC processing unit 126 may generate an error correction code for correcting a fail bit or an error bit of data transceived to/from the NVM device 110. The ECC processing unit 126 may perform the error correction encoding on the write data provided to the NVM device 110, and may configure the write data to which the parity bit has been added. The parity bit may be stored in the NVM device 110. In addition, the ECC processing unit 126 may perform the error correction decoding on the read data output by the NVM device 110. The ECC processing unit 126 may obtain ECC data in which the error has been corrected by using the parity bit on the read data read by a read operation. The ECC processing unit 126 may correct errors by using coded modulation such as a low density parity check (LDPC) code, the Bose-Chaudhuri-Hocquenghem (BCH) code, a turbo code, the Reed-Solomon code, a convolution code, a recursive systematic code (RSC), a trellis-coded modulation (TCM), and a block coded modulation (BCM).

Figure 2:
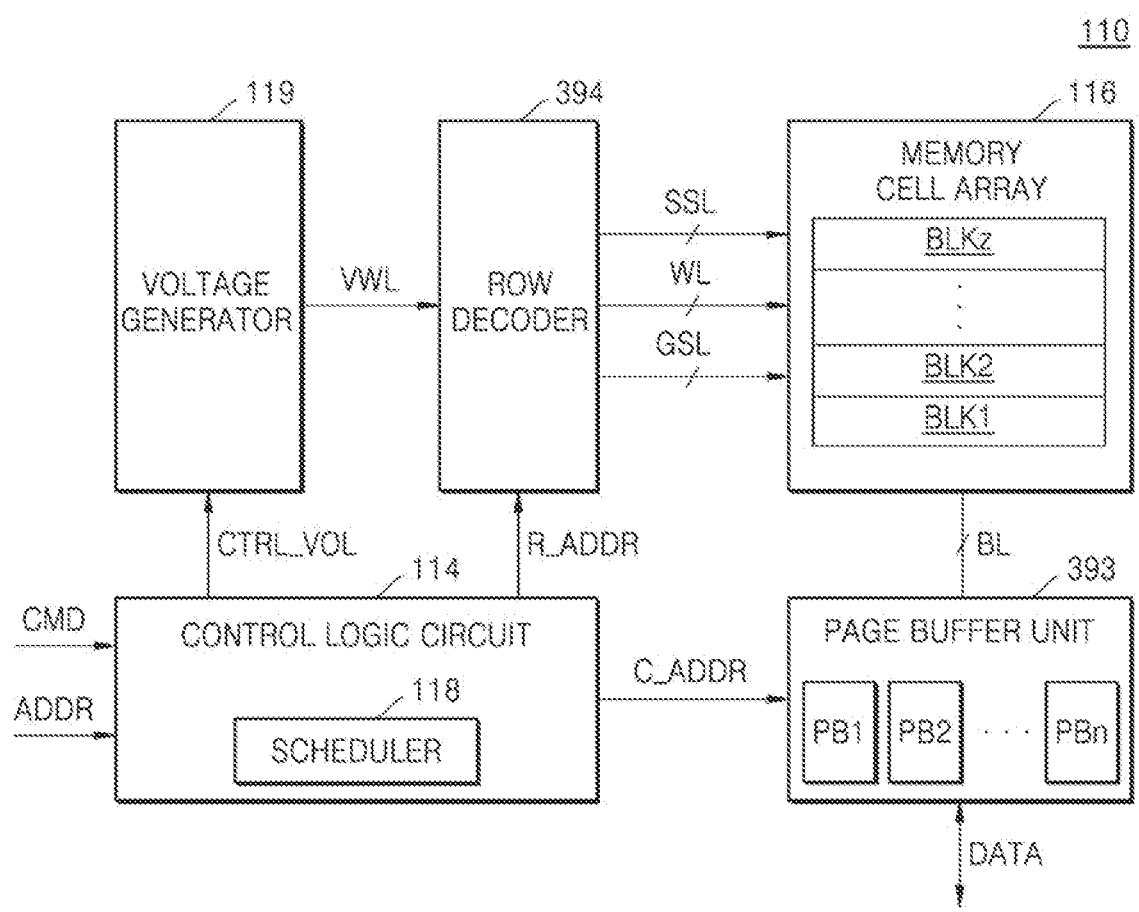
FIG. 2 is a block diagram of a non-volatile memory (NVM) device of a storage device according to an embodiment.

FIG. 2 is a block diagram of the NVM device 110 in the storage device 100 according to an embodiment.

Referring to FIGS. 1 and 2, the NVM device 110 may include the control logic circuit 114, the memory cell array 116, a voltage generator 119, a page buffer unit 393, and a row decoder 394. The NVM device 110 may further include a command decoder, an address decoder, an input/output circuit, etc.

The control logic circuit 114 may control various operation modes in the NVM device 110. The control logic circuit 114 may receive a command CMD and/or an address ADDR from the memory controller 120. The control logic circuit 114 may, based on the received command/address CMD/ADDR, output various internal control signals for performing program, read, and erase operations on the memory cell array 116. The control logic circuit 114 may provide a row address R_ADDR to the row decoder 394, provide a column address C_ADDR to the page buffer unit 393, and provide a voltage control signal CTRL_VOL to the voltage generator 119.

The control logic circuit 114 may include a scheduler 118, which not only adjusts voltage levels of corresponding control signals according to an operation mode of the NVM device 110, but also controls a voltage application time point and/or a voltage application time period, etc. The scheduler 118 may be implemented as a microcontroller unit (MCU) controlling operation characteristics of the NVM device 110. The scheduler 118 may control program, read and/or erase operation conditions of the memory cell array 116.

The memory cell array 116 may include the first memory block BLK1 through the $z^{th}$ memory block BLKz, and each of the first memory block BLK1 through the $z^{th}$ memory block BLKz may include a plurality of memory cells. The memory cell array 116 may be connected to the page buffer unit 393 via bit lines BL, and may be connected to the row decoder 394 via word lines WL, string select lines SSL, and ground select lines GSL.

In an example embodiment, the memory cell array 116 may include the 3D memory cell array, and the 3D memory cell array may include a plurality of memory NAND strings. Each memory NAND string may include memory cells each connected to the word lines WL, which are vertically stacked on a substrate.

The page buffer unit 393 may include a plurality of page buffers PB1~PBn (where, n is an integer greater than or equal to 2), and each of the plurality of page buffers PB1~PBn may be connected to the memory cells via the plurality of bit lines BL. The page buffer unit 393 may select at least one bit line BL of the plurality of bit lines BL in response to the column address C_ADDR. The page buffer unit 393 may operate as a write driver or a sense amplifier according to an operation mode. For example, during a program operation, the page buffer unit 393 may apply a bit line voltage corresponding to data to be programmed to the selected bit line BL. During a read operation, the page buffer unit 393 may sense data stored in the memory cell by sensing a current or a voltage of the selected bit line BL.

The voltage generator 119 may generate various types of voltages for performing program, read, and erase operations based on the voltage control signal CTRL_VOL. For example, the voltage generator 119 may generate a program voltage, a read voltage, a program verification voltage, an erase voltage, or the like, as a word line voltage VWL.

The row decoder 394 may select one of the plurality of word lines WL in response to the row address R_ADDR, select one of the plurality of string select lines SSL, and select one of the plurality of ground select lines GSL. For example, during the program operation, the row decoder 394 may apply the program voltage and the program verification voltage to the selected word line WL, and may apply the read voltage to the selected word line WL during the read operation.

According to the operation mode of the NVM device 110, voltage levels related to the program voltage for the selected word line WL, the program verification voltage and/or the read voltage, the erase voltage for a selected block, the bit line voltage for the selected bit line BL, or the like, the voltage application time point, the voltage application time period, or the like may be controlled by the scheduler 118. The scheduler 118 may control operation conditions of the NVM device 110 in conjunction with the MMU 125 of the memory controller 120.

Figure 3:
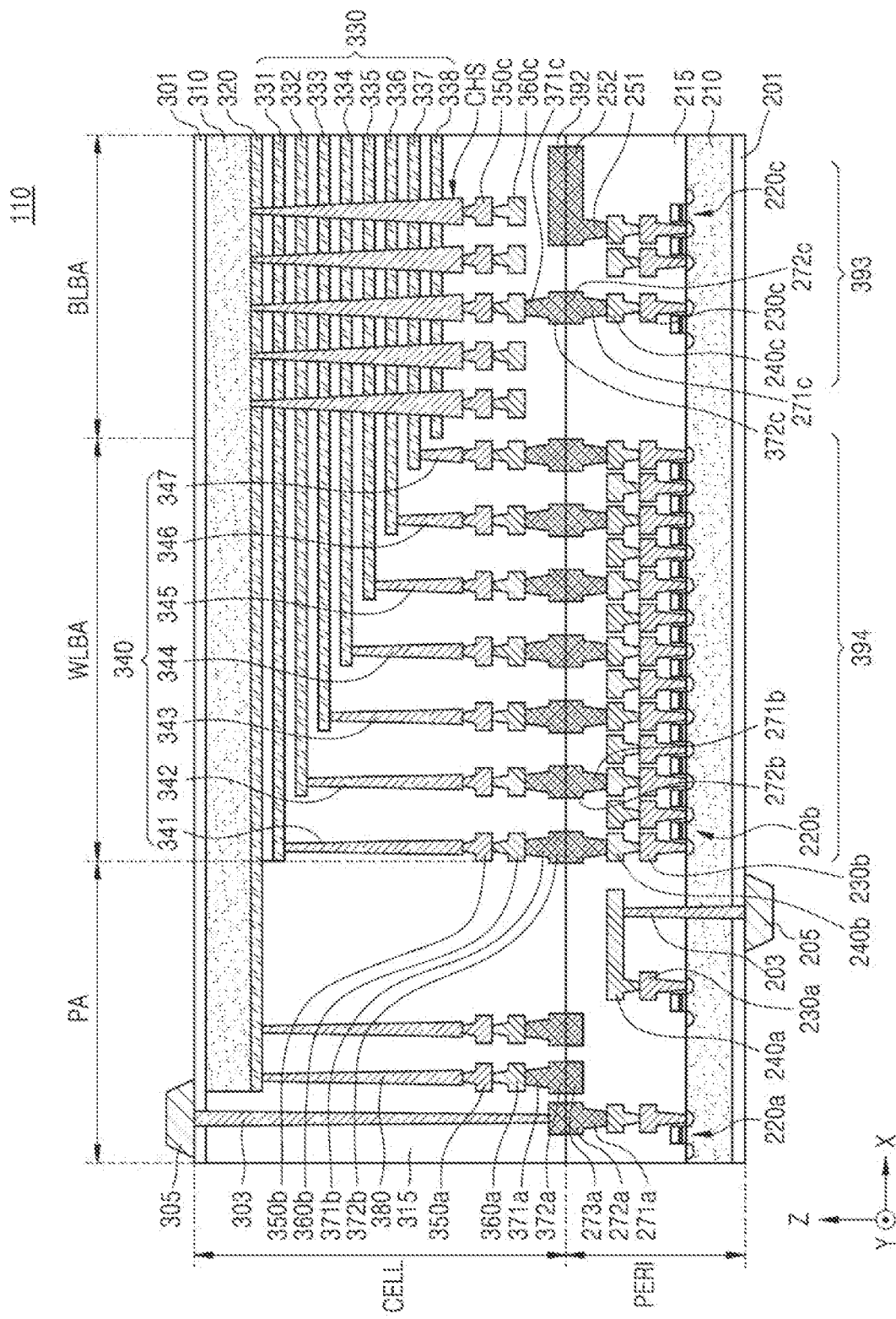
FIG. 3 is a diagram of a structure of a NVM device according to an embodiment.

FIG. 3 is a diagram of a structure of the NVM device 110 according to an embodiment.

Referring to FIG. 3, the NVM device 110 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, which is separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu-to-Cu bonding. However, embodiments of the inventive concept are not limited thereto. For example, the bonding metals may also be aluminum (Al) or tungsten (W).

Each of the peripheral circuit region PERI and the cell region CELL of the memory device 141 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c disposed on the first substrate 210, first metal layers 230a, 230b, and 230c respectively connected to the plurality of circuit elements 220a, 220b, and 220c, and second metal layers 240a, 240b, and 240c disposed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In the example embodiment illustrated in FIG. 3, although only the first metal layers 230a, 230b, and 230c and the second metal layers 240a, 240b, and 240c are shown and described, embodiments of the inventive concept are not limited thereto. For example, one or more additional metal layers may be further formed above the second metal layers 240a, 240b, and 240c. At least a portion of the one or more additional metal layers disposed above the second metal layers 240a, 240b, and 240c may be formed of aluminum or another metal having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide or silicon nitride.

Lower bonding metals 271b and 272b may be disposed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, or tungsten. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. Hereinafter, the cell region CELL will be described such that the second substrate 310 is at a bottom of the cell region CELL. That is, elements in the cell region CELL that are disposed closer the peripheral circuit PERI with respect to the second substrate 310 are above the second substrate 310, and elements in the cell region CELL that are further away from the peripheral circuit PERI with respect to the second substrate 310 are below the second substrate 310. On the second substrate 310, a plurality of word lines 330 (e.g., including word lines 331 to 338) may be stacked in a direction (e.g., a Z-axis direction), perpendicular to an upper surface of the second substrate 310. At least one string select line SSL and at least one ground select line GSL may be arranged on and below each of the plurality of word lines 330, respectively. That is, each of the plurality of word lines 330 may be disposed between the at least one string select line and the at least one ground select line.

In the bit line bonding area BLBA, a channel structure CHS may extend in a direction (e.g., a Z-axis direction), perpendicular to the upper surface of the second substrate 310, and pass through the plurality of word lines 330, the at least one string select line, and the at least one ground select line. The channel structure CHS may include a data storage layer, a channel layer, and a buried insulating layer, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In the example embodiment illustrated in FIG. 3, an area in which the channel structure CHS, and the bit line 360c are disposed may be referred to as the bit line bonding area BLBA. In the bit line bonding area BLBA, the bit line 360c may be electrically connected to the circuit elements 220c including a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 340 (e.g., cell contact plugs 341 to 347). The plurality of word lines 330 and the plurality of cell contact plugs 340 may be connected to each other by pads provided in at least a portion of the plurality of word lines 330 extending at different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372*b* of the cell region CELL and the lower bonding metals 271*b* and 272*b* of the peripheral circuit region PERI in the word line bonding area WLBA.

The plurality of cell contact plugs 340 may be electrically connected to the circuit elements 220*b* forming a row decoder 394 in the peripheral circuit region PERI. In an example embodiment, operating voltages of the circuit elements 220*b* of the row decoder 394 are different than operating voltages of the circuit elements 220*c* in the page buffer 393. For example, operating voltages of the circuit elements 220*c* in the page buffer 393 may be greater than operating voltages of the circuit elements 220*b* in the row decoder 394.

A common source line contact plug 380 may be disposed in the external pad bonding area PA. The common source line contact plug 380 may be formed of a conductive material such as a metal, a metal compound, or polysilicon, and may be electrically connected to the common source line 320. A first metal layer 350*a* and a second metal layer 360*a* may be stacked on an upper portion of the common source line contact plug 380, sequentially. For example, an area in which the common source line contact plug 380, the first metal layer 350*a*, and the second metal layer 360*a* are disposed may be the external pad bonding area PA.

A first input-output pad 205 and a second input-output pad 305 may be disposed in the external pad bonding area PA. Referring to FIG. 3, a lower insulating film 201 covering a lower surface of the first substrate 210 may be disposed below the first substrate 210, and the first input-output pad 205 may be disposed below the lower insulating film 201. The first input-output pad 205 may be connected to at least one of the plurality of circuit elements 220*a*, 220*b*, and 220*c* disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 3, an upper insulating film 301 covering the upper surface of the second substrate 310 may be disposed on the second substrate 310, and the second input-output pad 305 may be disposed on the upper insulating layer 301. The second input-output pad 305 may be connected to at least one of the plurality of circuit elements 220*a*, 220*b*, and 220*c* disposed in the peripheral circuit region PERI through a second input-output contact plug 303. In an example embodiment, the second input-output pad 305 is electrically connected to a circuit element 220*a*.

According to an example embodiment, the second substrate 310 and the common source line 320 are not disposed in an area in which the second input-output contact plug 303 is disposed. In other words, the second substrate 310 and the common source line 320 do not extend in the X-axis direction such that the second substrate 310 and the common source line 320 do not overlap with the second input-output contact plug 303 disposed in the external pad bonding area PA. Also, the second input-output pad 305 does not overlap the word lines 330 in the third direction (the Z-axis direction). Referring to FIG. 3, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to an example embodiment, the first input-output pad 205 and the second input-output pad 305 may be selectively formed. For example, the memory device 141 may include only the first input-output pad 205 disposed on the first substrate 210 or the second input-output pad 305 disposed on the second substrate 310. Alternatively or additionally, the memory device 141 may include both the first input-output pad 205 and the second input-output pad 305.

A metal pattern provided on an uppermost metal layer may be provided as a dummy pattern or the uppermost metal layer may not be included, in each of the external pad bonding area PA and the bit line bonding area BLBA, respectively included in the cell region CELL and the peripheral circuit region PERI.

In the external pad bonding area PA, the memory device 141 may include a lower metal pattern 273*a* in an uppermost metal layer of the peripheral circuit region PERI corresponding to an upper metal pattern 372*a* formed in an uppermost metal layer of the cell region CELL. The lower metal pattern 273*a* and the upper metal pattern 372*a* may have the same cross-sectional shape so as to be connected to each other. According to an embodiment, in the peripheral circuit region PERI, the lower metal pattern 273*a* formed in the uppermost metal layer of the peripheral circuit region PERI is not connected to a contact. Similarly, in the external pad bonding area PA, an upper metal pattern 372*a* formed in an uppermost metal layer of the peripheral circuit region PERI, and having the same shape as a lower metal pattern 273*a* of the peripheral circuit region PERI, may be formed in an uppermost metal layer of the cell region CELL.

The lower bonding metals 271*b* and 272*b* may be formed on the second metal layer 240*b* in the word line bonding area WLBA. In the word line bonding area WLBA, the lower bonding metals 271*b* and 272*b* of the peripheral circuit region PERI may be electrically connected to the upper bonding metals 371*b* and 372*b* of the cell region CELL by Cu-to-Cu bonding.

Further, in the bit line bonding area BLBA, an upper metal pattern 392 in the cell region CELL may correspond to a lower metal pattern 252 in the uppermost metal layer of the peripheral circuit region PERI. The upper metal pattern 392 and the lower metal pattern 252 may have the same cross-sectional shape. In an embodiment, a contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. In an embodiment, a contact may not be formed on the reinforcement metal pattern.

Figure 4:
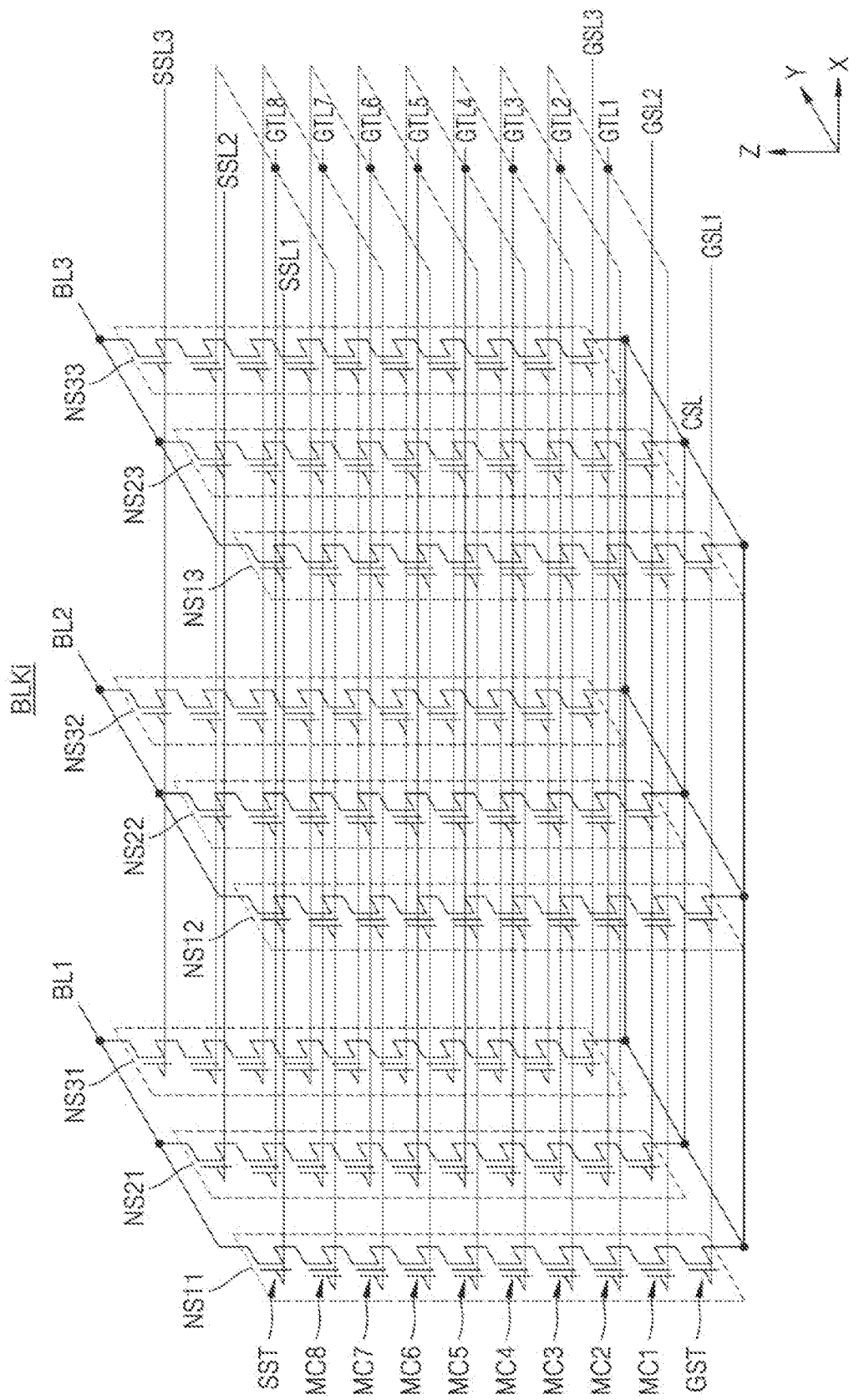
FIG. 4 is a circuit diagram of a memory block of a NVM device according to an embodiment.

FIG. 4 is a circuit diagram of a memory block according to an embodiment. The memory block illustrated in FIG. 4 illustrates the first memory block BLK1 as one example of the first memory block BLK1 through the $z^{th}$ memory block BLKz described with reference to FIG. 2. Hereinafter, embodiments are described in detail with the first memory block BLK1 as an example. The first memory block BLK1 may represent a 3D memory block formed in a 3D structure on a substrate. The plurality of memory cell strings included in the first memory block BLK1 may be formed in a direction D1 perpendicular to the substrate.

Referring to FIG. 4, the first memory block BLK1 may include NAND strings NS11 through NS33, word lines WL1 through WL8, bit lines BL1 through BL3, ground select lines GSL1 through GSL3, string select lines SSL1 through SSL3, and a common source line CSL. In FIG. 4, each of the NAND cell strings NS11 through N33 is illustrated to include eight memory cells MC1 through MC8 respectively connected to eight word lines WL1 through WL8, but the embodiment is not limited thereto.

Each NAND cell string (for example, NS11) may include a string select transistor SST, a plurality of memory cells MC, and a ground select transistor GST, which are connected to each other in series. The string select transistor SST may be connected to a string select line SSL1. The plurality of memory cells MC may be connected to word lines WL1 through WL8 respectively corresponding thereto. The ground select transistors GST may be connected to a ground select line GSL1 corresponding thereto. The string select transistors SST may be connected to bit lines BL1 through BL3 corresponding thereto, and the ground select transistor GST may be connected to the common source line CSL.

According to an embodiment, in each cell string, one or more dummy memory cells may be provided between the string select transistor SST and the memory cells MC. In each cell string, one or more dummy memory cells may be provided between the ground select transistor GST and the memory cells MC. In each cell string, one or more dummy memory cells may be provided between the memory cells MC. The dummy memory cells may have the same structure as the memory cells MC, and may not be programmed (for example, program inhibited) or may be programmed differently from the memory cells MC. For example, when the memory cells MC are programmed to have two or more threshold voltage distributions, the dummy memory cells may be programmed to have one threshold voltage distribution range or a less number of threshold voltage distributions than the memory cells MC.

Figure 5:
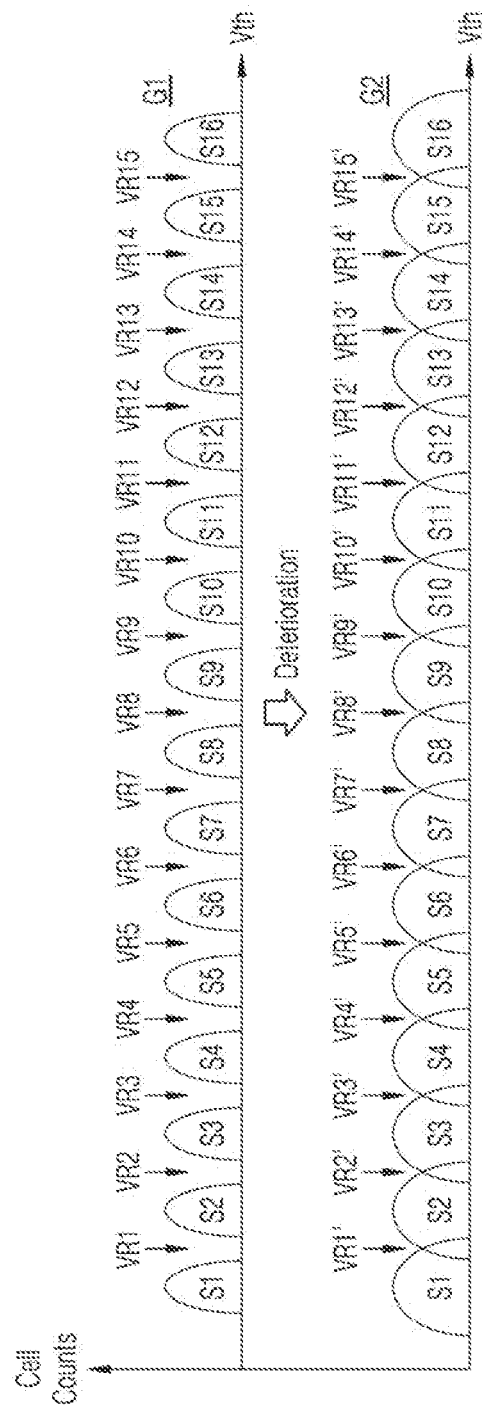
FIG. 5 illustrates graphs representing shifts of threshold voltage distributions of memory cells MC in FIG. 4.

FIG. 5 illustrates graphs representing shifts of threshold voltage distributions of memory cells MC in FIG. 4. In FIG. 5, each of graphs G1 and G2 may represent distributions of the threshold voltages of a certain word line in the first memory block BLK1, for example, the memory cells MC connected to a first word line. The horizontal axis may represent the threshold voltages of the memory cells MC, and the vertical axis may represent cell counts, that is, the number of memory cells MC.

Referring to FIG. 5, one or more bits may be programmed in a memory cell connected to the first word line. According to the number of bits stored in a memory cell, the memory cell may be classified into a single-level cell (SLC), a multi-level cell (MLC), a triple-level cell (TLC), or a quad-level cell (QLC). According to the number of bits stored in a memory cell, the memory cell may have different statuses. The statuses may be determined based on a range of a threshold voltage. In FIG. 5, the memory cell may be a QLC, and the threshold voltage of the memory cell may be programmed as one of 16 statuses, or S1 through S16.

To program data in the memory cell, a plurality of program loops may be performed until a program is completed according to an incremental step pulse programming (ISPP). As the program loop is increased, a program voltage of a selected memory cell may be incrementally increased. To reduce a program disturb, a program operation may have a program sequence in which the memory cells at an upper portion of a cell string is programmed first. An initialization operation or a pre-charge operation may be performed on channels of the plurality of cell strings before the program loop for the selected memory cell. However, when the memory cells at the upper portion of the cell string are in a programmed status, some channels corresponding to the programmed memory cells are negatively boosted, and due to a high threshold voltage of the programmed memory cells, the cell string may include incompletely initialized channels. A program disturb issue and/or a hot carrier injection issue due to these phenomena may significantly affect the memory cells arranged on the cell string.

To overcome these issues, the scheduler 118 of the NVM device 110 may control program operation conditions in conjunction with the MMU 125 of the memory controller 120. As an example, a program operation may be performed on the selected memory cell by setting the program voltage and/or a read voltage applied to the selected word line and voltage levels of the pre-charge voltages applied to a bit line and/or a source line, setting the voltage apply time point and/or the voltage apply time period, and controlling program operation conditions related to an operation of classifying one memory block in word line units and managing a plurality of small sub-blocks, or the like.

After data is programmed in the memory cell, disturb deterioration or retention deterioration may occur in the memory cell. The disturb deterioration may mean a phenomenon in which the threshold voltage of the memory cell is changed due to program, read, erase, coupling operations, or the like, occurring in a periphery of the memory cell. The retention deterioration may mean a phenomenon in which, after charges are captured in a charge capture layer of the memory cell and the memory cell is programmed, the threshold voltage of the memory cell may be changed due to outflow of the captured charges over time. When deterioration occurs in the memory cell, because the threshold voltage of the memory cell is changed, data of the memory cell may not be read when initially set read levels are used (that is, data damage). The data damage may cause reliability degradation of the storage device 100 and the NVM device 110.

In FIG. 5, when the memory cells show a distribution of threshold voltages like a G1 graph, optimum read levels for reading data stored in the memory cells may be VR1-VR15. Due to the deterioration, the G1 graph may be changed or moved to a G2 graph. When the memory cells show a distribution of threshold voltages like the G2 graph, optimum read levels for reading data stored in the memory cells may be VR1'-VR15', not VR1-VR15.

When the read operation is performed in conjunction with the MMU 125 of the memory controller 120, the scheduler 118 of the NVM device 110 may control read operation conditions. In other words, to perform the read operation on the selected memory cell connected to the first word line at the changed read levels VR1'-VR15', the read operation on the selected memory cell may be performed by adjusting target read levels and target develop time points and using the adjusted target read levels and the adjusted target develop time points.

Figure 6:
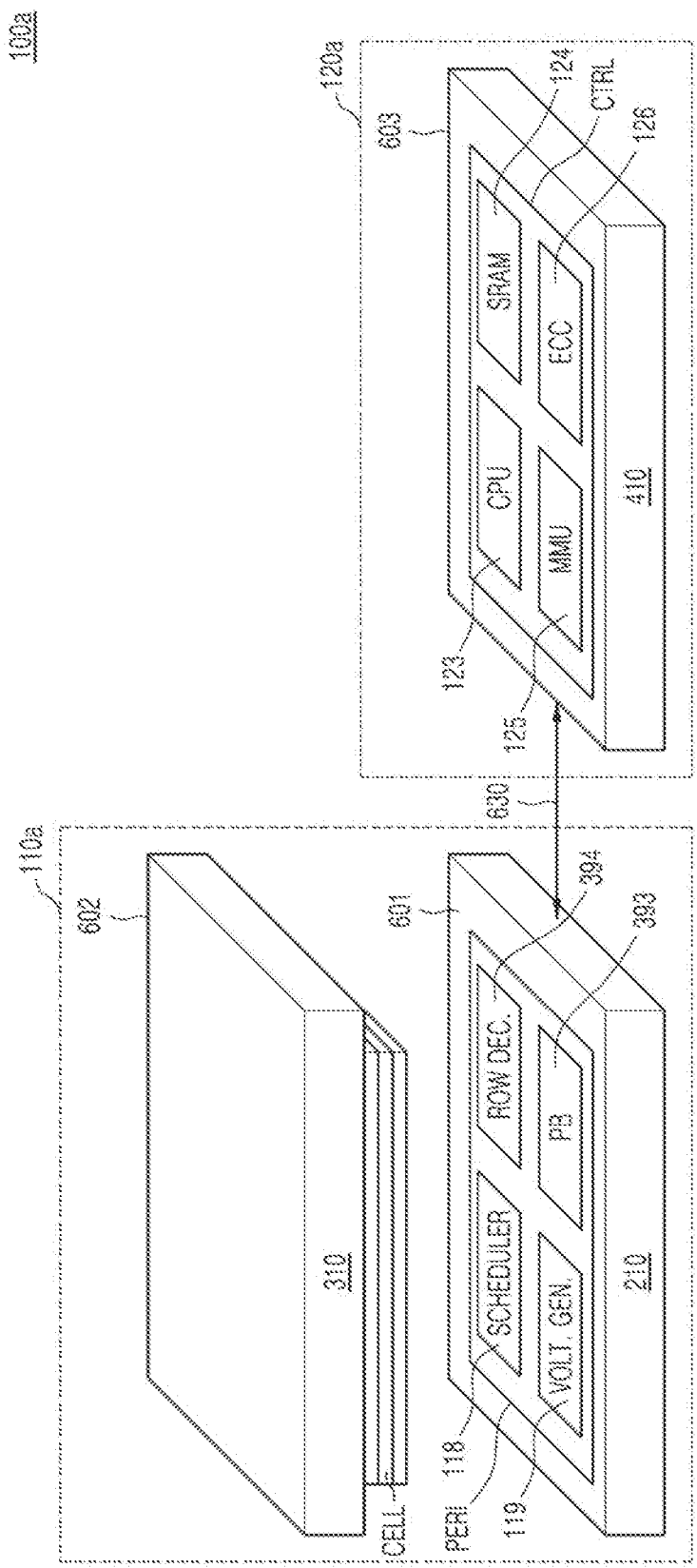
FIG. 6 is a diagram of a first example in which a storage device is implemented by using a three-dimensional (3D) wafer-to-wafer bonding according to an embodiment.

FIG. 6 is a diagram of a first example in which the storage device 100 of FIG. 1 is implemented by using 3D wafer-to-wafer bonding.

Referring to FIG. 6 in conjunction with FIGS. 1 through 3, in a storage device 100a, an NVM device 110a may include a first chip 601 including the peripheral circuit region PERI formed on a first substrate 210 and a second chip 602 including the cell region CELL formed on a second substrate 310. The NVM device 110a may be implemented by a wafer bonding method in which the second chip 602 is turned over to face the first chip 601, and as illustrated in FIG. 3, the upper bonding metals 372a, 372b, and 372c of the cell region CELL are electrically connected to the lower bonding metals 272a, 272b, and 272c of the peripheral circuit region PERI, respectively. In the peripheral circuit region PERI of the first chip 601, the scheduler 118, the voltage generator 119, the page buffer unit 393, and the row decoder 394 may be arranged. For convenience of description, the scheduler 118 of the control logic circuit 114 is described as being arranged in the peripheral circuit region PERI, but other circuits of the control logic circuit 114 may be arranged in the peripheral circuit region PERI.

A memory controller 120a may be implemented as a third chip 603 including a control circuit region CTRL formed on a third substrate 410. In the control circuit region CTRL, the CPU 123, the SRAM 124, the MMU 125, and the ECC processing unit 126 may be formed. The first chip 601, the second chip 602, and the third chip 603 may be manufactured by using different processes from each other.

After the first chip 601 is wafer bonded to the second chip 602, the first input-output pad 205 and the second input-output pad 305 of the external pad bonding area PA, which are respectively formed on rear surfaces of the first substrate 210 and the second substrate 310, may be electrically connected to the memory controller 120 via conductive wire(s) 630. For simplicity, one conductive wire 630 is illustrated in FIG. 6. The conductive wire 630 may carry signals transmitted and received between the NVM device 110a and the memory controller 120a (for example, a chip enable signal nCE, a command latch enable signal CLE, an address latch enable signal ALE, a write enable signal nWE, the command, a plurality of data signals DQ, in which addresses and data are transferred, a read enable signal nRE, and a data strobe signal DQS). However, the embodiment is not limited thereto, and the one or more embodiments may include a plurality of conductive wires.

Figure 7A:
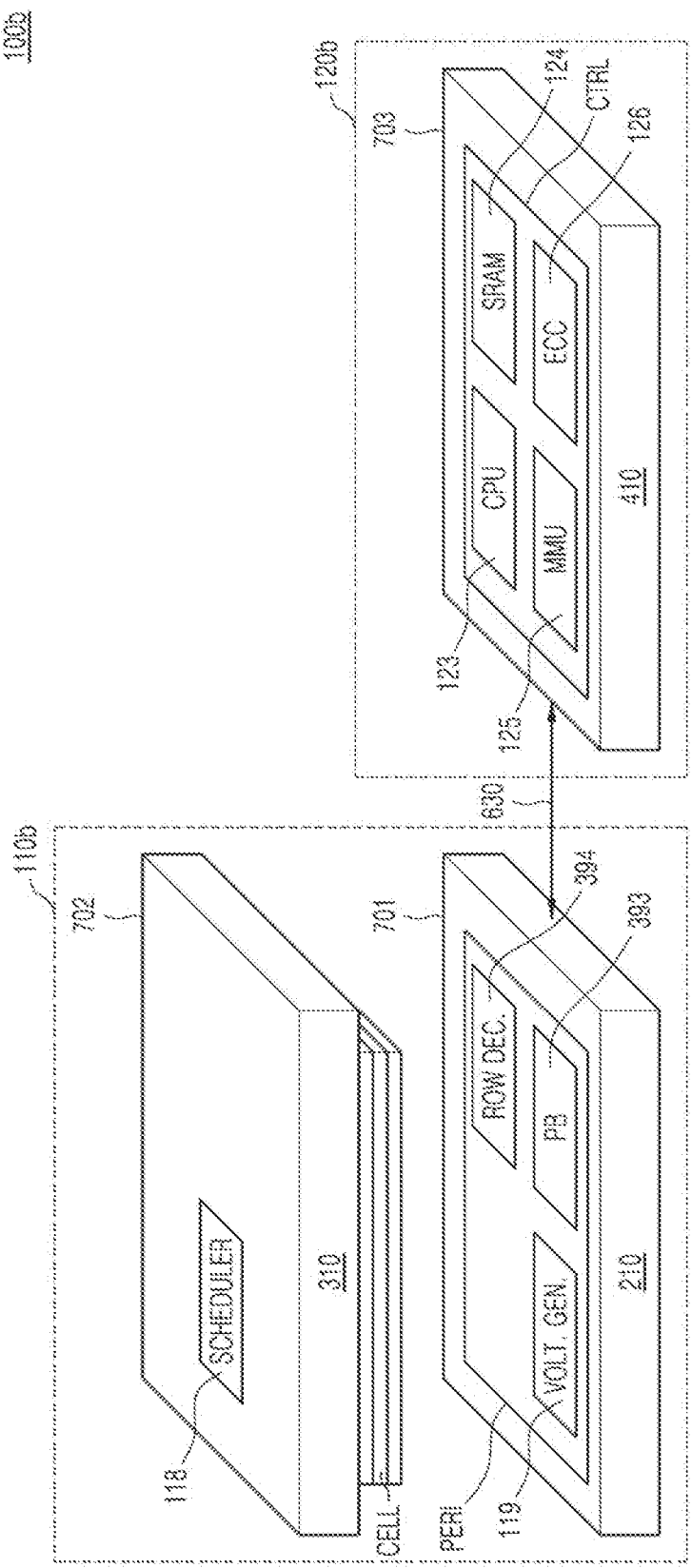
FIGS. 7A and 7B are diagrams of a second example in which a storage device of FIG. 1 is implemented by using a three-dimensional (3D) wafer-to-wafer bonding according to an embodiment.
Figure 7B:
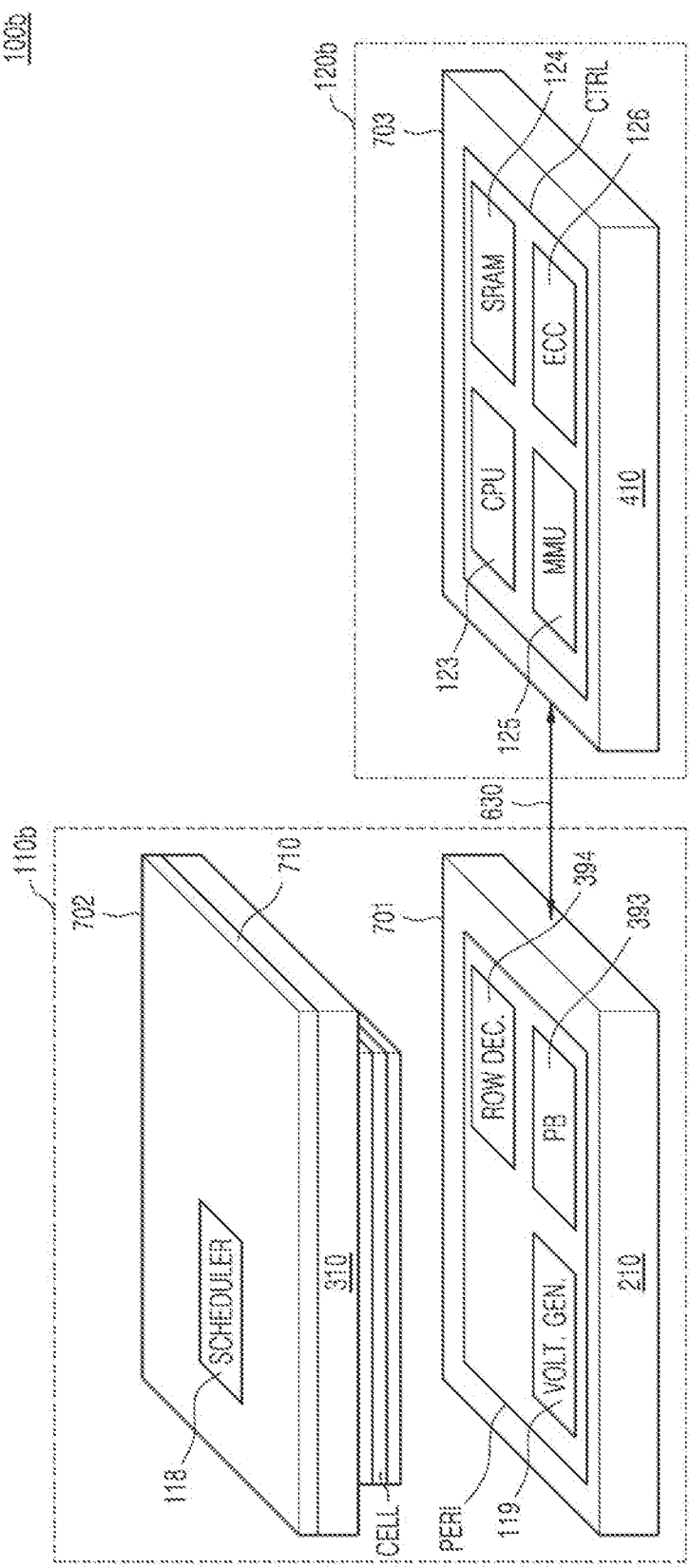

FIGS. 7A and 7B are diagrams of a second example in which the storage device 100 of FIG. 1 is implemented by using 3D wafer-to-wafer bonding. A storage device 100b of FIG. 7A may be different the storage device 100a of FIG. 6 in that the scheduler 118 included in the peripheral circuit region PERI of the first chip 601 in FIG. 6 is arranged on a rear surface of the second substrate 310 of a second chip 702 in FIG. 7A.

Referring to FIG. 7A in conjunction with FIGS. 1 through 3, an NVM device 110b may include a first chip 701 including the peripheral circuit region PERI formed on the first substrate 210 and the second chip 602 including the cell region CELL formed on a second substrate 310. In the peripheral circuit region PERI of the first chip 701, the voltage generator 119, the page buffer unit 393, and the row decoder 394 may be arranged. In the second chip 702, the cell region CELL may be formed on a first surface of the second substrate 310, and circuit components of the scheduler 118 may be formed on a second surface of the second substrate 310. The circuit components of the scheduler 118 may be disposed directly on the second surface of the second substrate 310. Alternatively, as illustrated in FIG. 7B, after an oxide layer and a polysilicon layer 710 are formed on the second surface of the second substrate 310, the circuit components of the scheduler 118 may be formed on a surface of the polysilicon layer 710.

Figure 8:
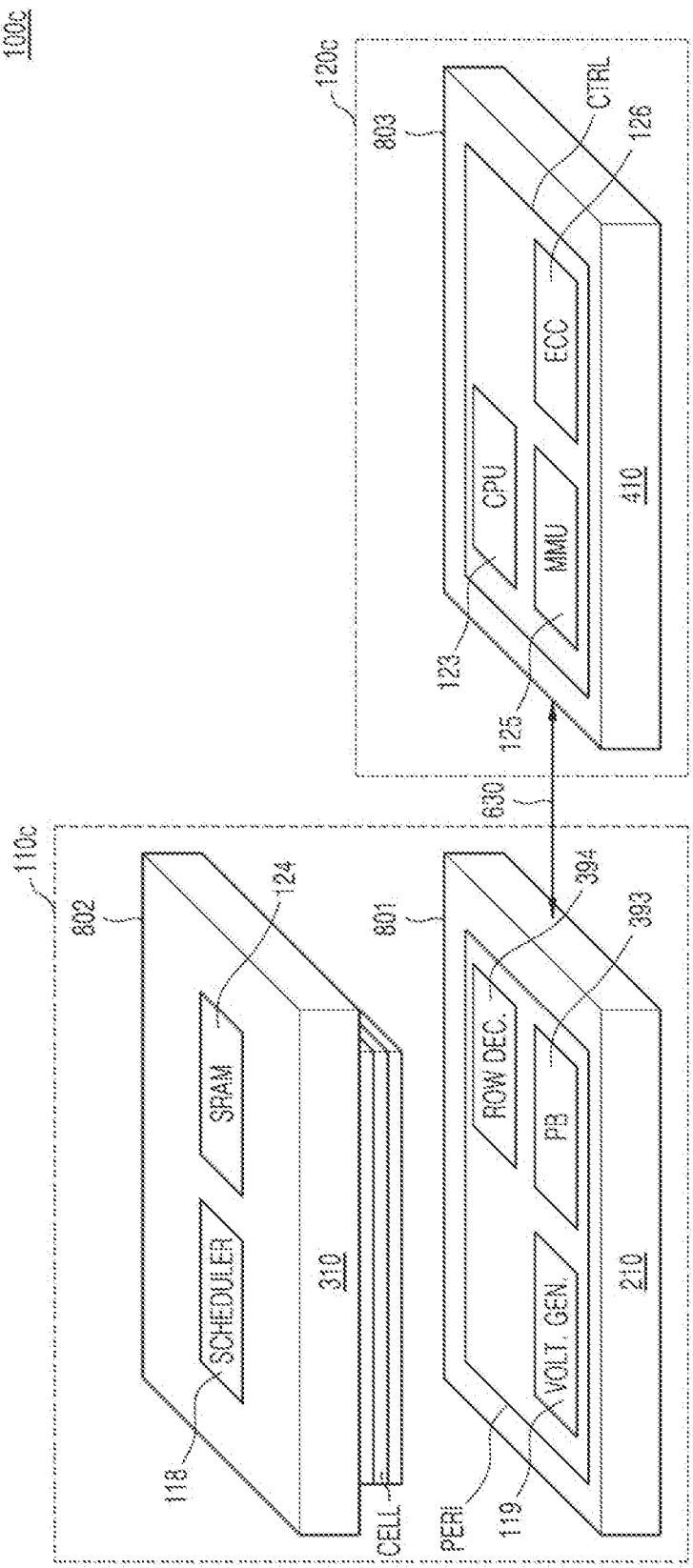
FIG. 8 is a diagram of a third example in which a storage device is implemented by using a three-dimensional (3D) wafer-to-wafer bonding according to an embodiment.

FIG. 8 is a diagram of a third example in which the storage device 100 of FIG. 1 is implemented by using 3D wafer-to-wafer bonding. A storage device 100c of FIG. 8 may be different from the storage device 100b of FIG. 7A in that the SRAM 124 in the memory controller 120b is arranged along with the scheduler 118 on the second surface of the second substrate 310 of the second chip 802.

Referring to FIG. 8 in conjunction with FIGS. 1 through 3, an NVM device 110c may include a first chip 801 including the peripheral circuit region PERI formed on the first substrate 210 and the second chip 802 including the cell region CELL formed on a second substrate 310. In the peripheral circuit region PERI of the first chip 801, the voltage generator 119, the page buffer unit 393, and the row decoder 394 may be arranged. In the second chip 802, the cell region CELL may be formed on a first surface of the second substrate 310, and circuit components of the scheduler 118 and the SRAM 124 may be formed on the second surface of the second substrate 310.

The scheduler 118 may control an operation of the NVM device 110c by setting program operation conditions, read operation conditions, and/or erase operation conditions. The scheduler 118 may, when operation conditions of the NVM device 110c are set or changed, store the operation conditions of the NVM device 110c in the SRAM 124. The scheduler 118 may be configured to access the SRAM 124, and may set or change the operation conditions of the NVM device 110c by using information stored in the SRAM 124.

Figure 9:
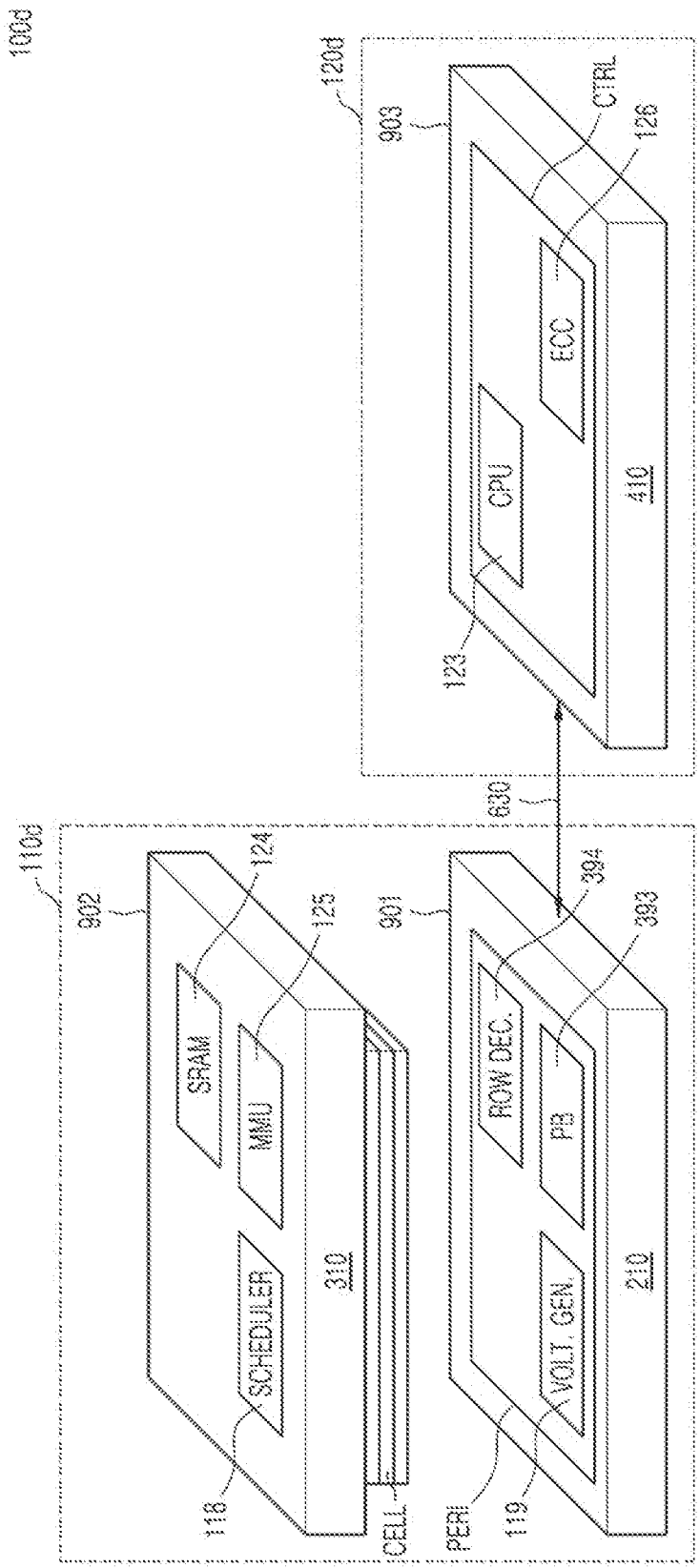
FIG. 9 is a diagram of a fourth example in which a storage device is implemented by using a three-dimensional (3D) wafer-to-wafer bonding according to an embodiment.

FIG. 9 is a diagram of a fourth example in which the storage device 100 of FIG. 1 is implemented by using 3D wafer-to-wafer bonding. A storage device 100d of FIG. 9 may be different from the storage device 100c of FIG. 8 in that the MMU 125 in the memory controller 120c is arranged along with the scheduler 118 and the SRAM 124 on the second surface of the second substrate 310 of the second chip 902.

Referring to FIG. 9 in conjunction with FIGS. 1 through 3, an NVM device 110d may include a first chip 901 including the peripheral circuit region PERI formed on the first substrate 210 and the second chip 902 including the cell region CELL formed on the second substrate 310. In the peripheral circuit region PERI of the first chip 901, the voltage generator 119, the page buffer unit 393, and the row decoder 394 may be arranged. In the second chip 902, the cell region CELL may be formed on the first surface of the second substrate 310, and circuit components of the scheduler 118, the SRAM 124, and the MMU 125 may be formed on the second surface of the second substrate 310.

In the second chip 902, the scheduler 118 may be arranged adjacent to the MMU 125. Various code related to operation conditions of the NVM device 110d stored in the MMU 125 may be promptly transferred to the scheduler 118 arranged adjacent to the MMU 125. Accordingly, a high speed operation performance of the storage device 100b may be improved by the scheduler 118, which is combined with the MMU 125.

Figure 10:
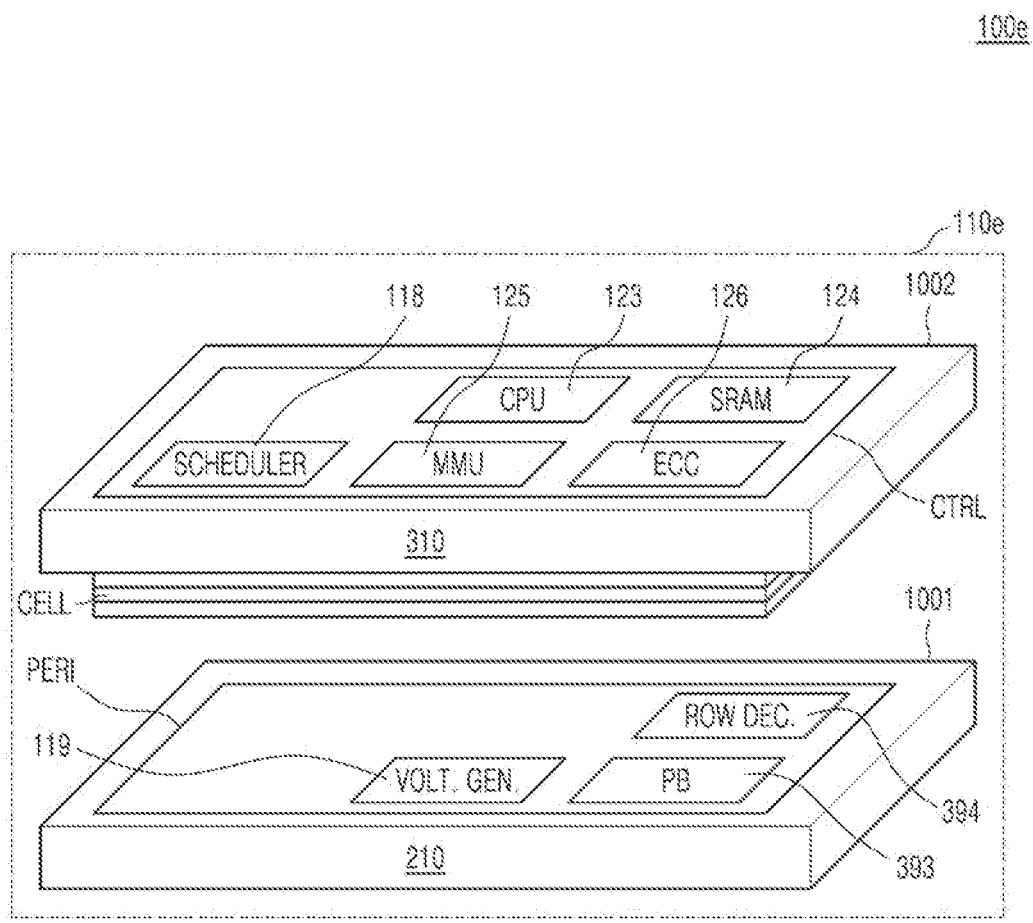
FIG. 10 is a diagram of a fifth example in which a storage device is implemented by using a three-dimensional (3D) wafer-to-wafer bonding according to an embodiment.

FIG. 10 is a diagram of a fifth example in which the storage device 100 of FIG. 1 is implemented by using 3D wafer-to-wafer bonding. A storage device 100e of FIG. 10 may be different from the storage device 100a of FIG. 6 in that the scheduler 118 and the memory controller 120 are arranged on the second surface the second substrate 310 of the second chip 1002.

Referring to FIG. 10 in conjunction with FIGS. 1 through 3, an NVM device 110e may include a first chip 1001 including the peripheral circuit region PERI formed on the first substrate 210 and a second chip 1002 including the cell region CELL and the control circuit region CTRL formed on the second substrate 310. In the peripheral circuit region PERI of the first chip 1001, the voltage generator 119, the page buffer unit 393, and the row decoder 394 may be arranged. In the second chip 1002, the cell region CELL may be formed on the first surface of the second substrate 310, and circuit components of the scheduler 118, the CPU 123, the SRAM 124, the MMU 125, and the ECC processing unit 126 may be formed on the second surface of the second substrate 310.

In the second chip 1002, the scheduler 118 may be arranged adjacent to the MMU 125. Various code related to operation conditions of the NVM device 110e stored in the MMU 125 may be promptly transferred to the scheduler 118 arranged adjacent to the MMU 125.

The storage device 100e may be configured such that the memory controller 120a and the NVM device 110a (shown in FIG. 6) are directly connected to each other without the conductive wire 630, as shown in FIG. 6. Accordingly, the storage device 100e may not need to separately arrange the memory interface 122 (shown in FIG. 1), and thus, may reduce the overall size of the storage device. In addition, because the storage device 100e is not affected by signal line environment such as interference distortion, reflection noise, and/or crosstalk caused by the conductive wire 630, the high speed operation performance of the storage device 100e may be improved. According to an embodiment, circuit components of the scheduler 118, the CPU 123, the SRAM 124, the MMU 125, and the ECC processing unit 126, which belong to the control circuit region CTRL, may be formed on the first surface of the first substrate 210 of the first chip 1001. According to another embodiment, circuit components of the scheduler 118, the CPU 123, the SRAM 124, the MMU 125, and the ECC processing unit 126, which belong to the control circuit region CTRL, may also be formed on the second surface, that is, the rear surface of the first surface formed in the peripheral circuit region PERI of the first substrate 210 of the first chip 1001.

Figure 11:
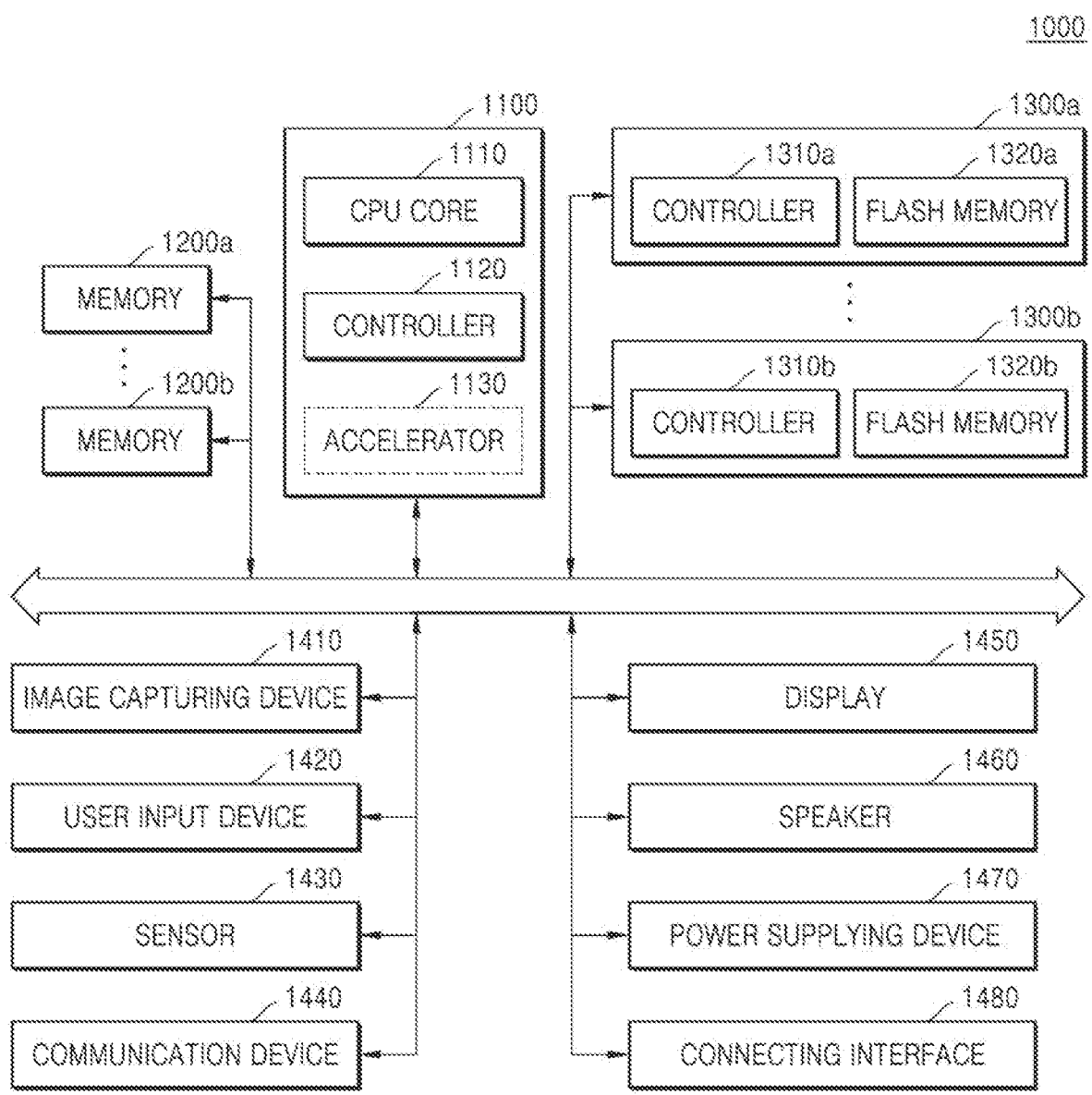
FIG. 11 is a diagram of a system including a storage device according to an embodiment.

FIG. 11 is a diagram of a system 1000 including a storage device according to an embodiment. The system 1000 of FIG. 11 may include a mobile system such as a mobile phone, a smartphone, a tablet personal computer (PC), a wearable device, a health care device, or an Internet of Things (IoT) device. However, the system 1000 of FIG. 11 is not limited to the mobile system, and may also include a PC, a laptop computer, a server, a media player, or an automotive device such as a navigation device.

Referring to FIG. 11, the system 1000 may include a main processor 1100, memories 1200a and 1200b, and storage devices 1300a and 1300b, one or more image capturing device 1410, a user input device 1420, a sensor 1430, a communication device 1440, a display 1450, a speaker 1460, a power supplying device 1470, and a connecting interface 1480.

The main processor 1100 may control an overall operation of the system 1000, and more particularly, may control operations of other components constituting the system 1000. The main processor 1100 may be implemented as a general purpose processor, a dedicated processor, an application processor, etc.

The main processor 1100 may include one or more CPU cores 1110, a controller 1120 for controlling the memories 1200a and 1200b. Although FIG. 11 illustrates that the storage devices 1300a and 1300b are separated from the main processor 110, the main processor 110 may also include the storage devices 1300a and 1300b. According to an embodiment, the main processor 1100 may further include an accelerator 1130, which is a dedicated circuit for a high speed data computation such as an artificial intelligence (AI) data computation. The accelerator 1130 may include a graphics processing unit (GPU), a neural processing unit (NPU), and/or a data processing unit (DPU), or the like, and may be implemented as a separate chip, which is physically independent of other components of the main processor 1100.

The memories 1200a and 1200b may be used as a main memory device of the system 1000, and may include a volatile memory such as SRAM and/or DRAM, but may also include an NVM such as a flash memory, PRAM, and/or RRAM. The memories 1200a and 1200b may be implemented in the same package as the main processor 1100.

The storage devices 1300a and 1300b may store data as a non-volatile storage device regardless of a power supply, and may have a relatively larger storage capacity than the memories 1200a and 1200b. The storage devices 1300a and 1300b may include memory controllers 1310a and 1310b, and NVM devices 1320a and 1320b storing data under the control of the memory controllers 1310a and 1310b. The NVM devices 1320a and 1320b may include a V-NAND flash memory having a 2-dimensional (2D) or 3D structure, but may also include an NVM of different types such as PRAM and/or RRAM.

The storage devices 1300a and 1300b may also be included in the system 1000 in a state of physical separation from the main processor 1100, and may also be implemented in the same package as the main processor 1100. In addition, the storage devices 1300a and 1300b may have a shape like a memory card, and accordingly, the storage devices 1300a and 1300b may also be combined with other components of the system 1000 in a removable manner via an interface such as the connecting interface 1480, which will be described in more detail below. The storage devices 1300a and 1300b may include devices to which a standard convention such as universal flash storage (UFS) is applied, but are not limited thereto.

The storage devices 1300a and 1300b may correspond to the storage device 100 described with reference to FIGS. 1 through 10. In the storage devices 1300a and 1300b, a first chip in which a peripheral circuit region including a control logic circuit controlling the operation modes of the NVM devices 1320a and 1320b is formed on a first surface of a first substrate may be wafer bonded to a second chip in which 3D arrays of NVM cells are formed on a first surface of a second substrate. On the second surface of the second substrate of the second chip, at least one of the circuits constituting a memory controller may be arranged, or all of the memory controller circuits may be arranged. On the second surface of the second substrate of the second chip, a scheduler which is a portion of a control logic circuit controlling operation conditions of the NVM devices 1320a and 1320b, at least one of circuits constituting a memory controller, or the entire memory controller circuits may be arranged.

An image capturing device 1410 may capture static image or video image, and may include a camera, a camcorder, and/or a webcam, etc.

The user input device 1420 may receive various types of data input by a user of the system 1000, and may include a touch pad, a keypad, a keyboard, a mouse, and/or a microphone.

The sensor 1430 may sense various types of physical amount obtainable from the outside of the system 1000, and may convert the sensed physical amount into an electrical signal. The sensor 1430 may include a temperature sensor, a pressure sensor, an illuminance sensor, a location sensor, an acceleration sensor, a biosensor, and/or a gyroscope, etc.

The communication device 1440 may perform transceiving of a signal between other devices outside the system 1000 according to various communication protocols. The communication device 1440 may be implemented by including an antenna, a transceiver, and/or a MODEM, etc.

The display 1450 and the speaker 1460 may function as output devices for outputting visual information and audio information to a user of the system 1000, respectively.

The power supplying device 1470 may properly convert power supplied by a battery included in the system 1000 and/or an external power source outside the system 1000, and provide the converted power to each component of the system 1000.

The connecting interface 1480 may provide a connection between the system 1000 and an external device, which is connected to the system 1000 and exchanges data with the system 1000. The connecting interface 1480 may be implemented by using various interface methods such as advanced technology attachment (ATA), serial ATA (SATA), external SATA (e-SATA), small computer system interface (SCSI), serial attached SCSI (SAS), peripheral component interconnect (PCI), PCI express (PCIe), NVM express (NVMe), IEEE 1394, universal serial bus (USB), a secure digital (SD) card, a multi-media card (MMC), an embedded MMC (eMMC), universal flash storage (UFS), embedded UFS (eUFS), and a compact flash (CF) card interface.

Figure 12:
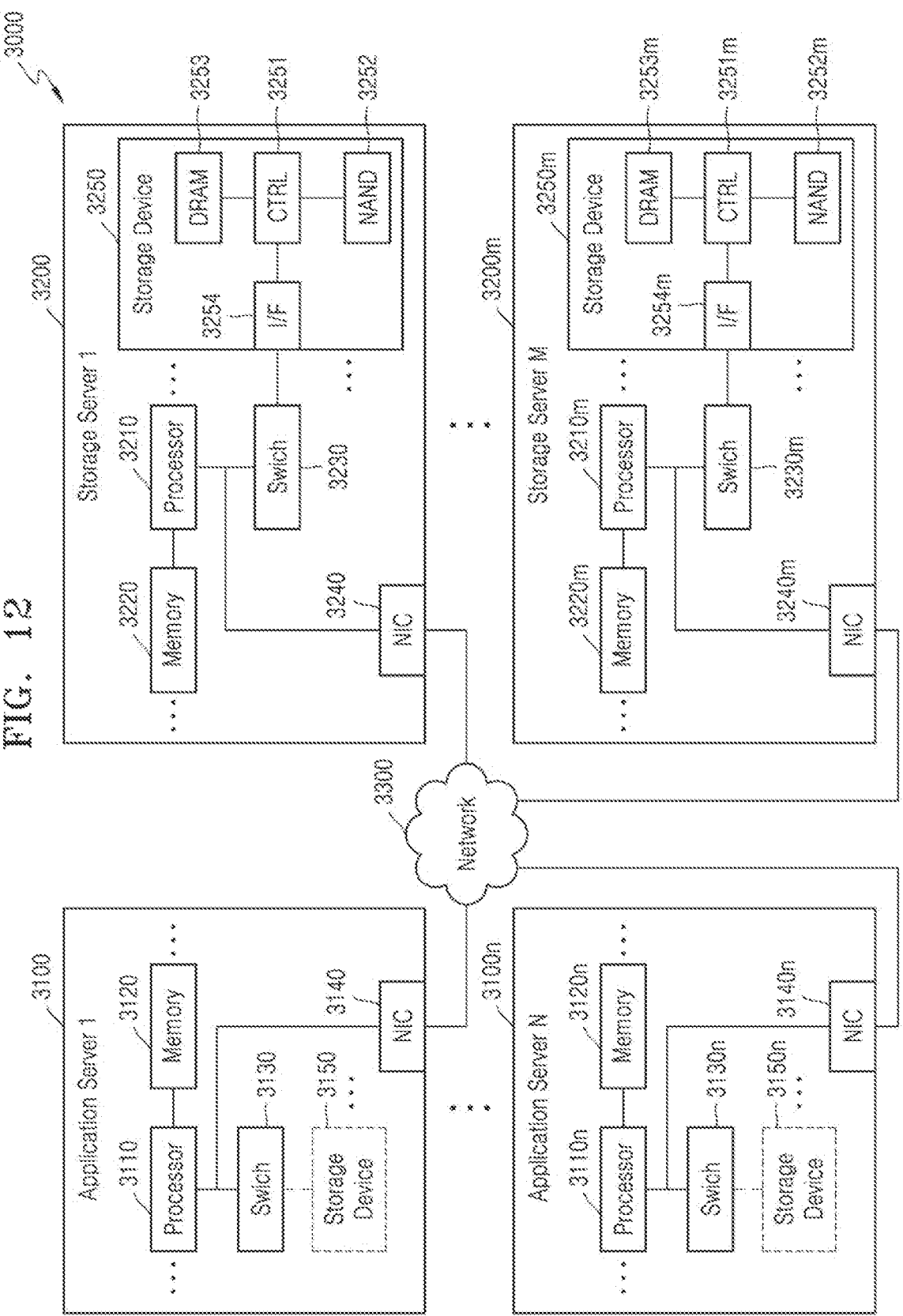
FIG. 12 is a diagram of a data center including a storage device according to an embodiment.

FIG. 12 is a diagram of a data center 3000 including a storage device according to an embodiment.

Referring to FIG. 12, the data center 3000 may include a facility where various data is collected and services are provided, and may also be referred to as a data storage center. The data center 3000 may include a system for using a search engine and a database, and may include a computing system used by a corporate such as a bank and a government agency. The data center 3000 may include application servers 3100 through 3100*n* and storage servers 3200 through 3200*m*, where n and m are integers greater than or equal to 1. The number of application servers 3100 through 3100*n* and the number of storage servers 3200 through 3200*m* may be variously selected according to embodiments, and the number of application servers 3100 through 3100*n* may be different from the number of storage servers 3200 through 3200*m*.

The application server 3100 and the storage server 3200 may include processors 3110 and 3210 and memories 3120 and 3220, respectively. Referring to the storage server 3200 as an example, the processor 3210 may control the overall operation of the storage server 3200, and execute commands and/or data loaded in the memory 3220 by accessing the memory 3220. The memory 3220 may include double data rate (DDR) synchronous DRAM (DDR SDRAM), high bandwidth memory (HBM), hybrid memory cube (HMC), dual in-line memory module (DIMM), optane DIMM, or NVM DIMM (NVM DIMM). According to an embodiment, the number of processors 3210 and the number of memories 3220 included in the storage server 3200 may be variously selected. In an embodiment, the processor 3210 and the memory 3220 may provide a processor-memory pair. In an embodiment, the number of processors 3210 may be different from the number of memories 3220. The processor 3210 may include a single-core processor or a multi-core processor. The above-description of the storage server 3200 may be similarly applied to the application server 3100. According to an embodiment, the application server 3100 may not include a storage device 3150. The storage server 3200 may include at least one storage device 3250. The number of storage devices 3250 included in the storage server 3200 may be variously selected according to embodiments.

The application servers 3100 through 3100*n* may communicate with the storage servers 3200 through 3200*m* via a network 3300. The network 3300 may be implemented by using fiber channel (FC) or Ethernet. In this case, the FC may be a medium used for relatively high speed data transmission, and may use an optical switch providing high performance/high availability. According to an access method of the network 3300, the storage servers 3200 through 3200*m* may be provided as file storages, block storages, or object storages.

In an embodiment, the network 3300 may include a storage-dedicated network such as a storage area network (SAN). For example, the SAN may include a FC-SAN that is implemented according to FC protocol (FCP) by using an FC network. In another example, the SAN may include an internet protocol (IP) SAN (IP SAN), which uses a transmission control protocol (TCP) (TCP/IP) network and is implemented according to an internet (i) small computer system interface (SCSI) (iSCSI) protocol (or SCSI over transmission control protocol (TCP)/IP (TCP/IP)). In another embodiment, the network 3300 may include a general network such as a TCP/IP network. For example, the network 3300 may be implemented according to a protocol such as FC over Ethernet (FCoE), network-attached storage (NAS), and node version manager (NVM) express (NVMe) over fabrics (oF) (NVMe-oF).

Hereinafter, the application server 3100 and the storage server 3200 are mainly described. Descriptions of the application server 3100 may be applied to other application servers (for example, the application server 3100*n*), and descriptions of the storage server 3200 may be applied to other storage servers (for example, the storage server 3200*m*).

The application server 3100 may store data requested to be stored by a user or client in one of the storage servers 3200 through 3200*m* via the network 3300. In addition, the application server 3100 may obtain data requested to be read by the user or client from one of the storage servers 3200 through 3200*m* via the network 3300. For example, the application server 3100 may be implemented as a web server or a database management system (DBMS).

The application server 3100 may access the memory 3120*n* or a storage device 3150*n* included in the application server 3100*n* via the network 3300, or may access memories 3220 through 3220*m* or storage devices 3250 through 3250*m*, which are respectively included in the storage servers 3200 through 3200*m*, via the network 3300. Thus, the application server 3100 may perform various operations on data stored in the application servers 3100 through 3100*n* and/or the storage servers 3200 through 3200*m*. For example, the application server 3100 may execute a command for moving or copying data between the application servers 3100 through 3100*n* and/or the storage servers 3200 through 3200*m*. In this case, data may be moved from the storage devices 3250 through 3250*m* of the storage servers 3200 through 3200*m*, via the memories 3220 through 3220*m* of the storage servers 3200 through 3200*m*, or directly, to the memories 3120 through 3120*n* of the application servers 3100 through 3100*n*. Data to be moved via the network 3300 may be data encrypted for security or privacy.

Referring to the storage server 3200 as an example, an interface (I/F) 3254 may provide a physical connection between the processor 3210 and a controller (CTRL) 3251, and a physical connection between a network interface controller (NIC) 3240 and the CTRL 3251. For example, the I/F 3254 may be implemented by a direct attached storage (DAS) method in which the storage device 3250 is directly connected to a dedicated cable. In addition, for example, the I/F 3254 may be implemented by various interface methods such as advanced technology attachment (ATA), serial ATA (SATA), external SATA (e-SATA), small computer system interface (SCSI), serial attached SCSI (SAS), peripheral component interconnect (PCI), PCI express (PCIe), node version manager (NVM) express (NVMe), IEEE 1394, universal serial bus (USB), a secure digital (SD) card, a multi-media card (MMC), an embedded multi-media card (eMMC), universal flash storage (UFS), embedded universal flash storage (eUFS), and a compact flash (CF) card.

The storage server 3200 may further include a switch 3230 and the NIC 3240. The switch 3230 may selectively connect the processor 3210 to the storage device 3250 under the control of the processor 3210, or may selectively connect the NIC 3240 to the storage device 3250.

In an embodiment, the NIC 3240 may include a network interface card, a network adapter, etc. The NIC 3240 may be connected to the network 3300 via a wired interface, a wireless interface, a Bluetooth interface, an optical interface, etc. The NIC 3240 may include an internal memory, a digital signal processor (DSP), a host bus interface, or the like, and may be connected to the processor 3210 and/or the switch 3230 via the host bus interface. The host bus interface may also be implemented as one of the examples of the I/F 3254 described above. In an embodiment, the NIC 3240 may also be integrated with at least one of the processor 3210, the switch 3230, and the storage device 3250.

In the application servers 3100 through 3100*m* or the storage servers 3200 through 3200*m*, a processor may program or read data by transmitting commands to storage devices 3150 through 3150*n* and 3250 through 3250*m* or memories 3120 through 3120*n* and 3220 through 3220*m*. In this case, the data may be an error-corrected data processed by using an ECC engine. The data may be data processed by data bus inversion (DBI) or data masking (DM), and may include cyclic redundancy code (CRC) information. The data may be encrypted data for security or privacy.

The storage devices 3150 through 3150*m* and 3250 through 3250*m* may transmit control signals and command/address signals to NAND flash memory devices (NAND) 3252 through 3252*m*, in response to read commands received from processors. Accordingly, when data is read from the NAND 3252 through 3252*m*, a read enable (RE) signal may be input as a data output control signal, and output the data to the DQ bus. The DQS may be generated by using the RE signal. The command and the address signal may be latched in a page buffer according to a rising edge or falling edge of a write enable (WE) signal.

The CTRL 3251 may control the overall operation of the storage device 3250. In an embodiment, the CTRL 3251 may include SRAM. The CTRL 3251 may write data in the NAND 3252 in response to a write command, or may read data from the NAND 3252 in response to the read command. For example, the write command and/or the read command may be provided by the processor 3210 in the storage server 3200, the processor 3210*m* in the storage server m 3200*m*, or by the processors 3110 and 3110*n*, which are respectively included in the application servers 3100 and 3100*n*. DRAM 3253 may temporarily store (buffer) data to be written in the NAND 3252 or data read from the NAND 3252. In addition, the DRAM 3253 may store meta data. In this case, the meta data may include data generated by the CTRL 3251 for managing user data or the NAND 3252. The storage device 3250 may include a secure element (SE) for security or privacy.

A storage device according to embodiments of the inventive concept may include a peripheral circuit region including a control logic circuit controlling operation modes of an NVM device, in which a first chip formed on a first surface of a first substrate is wafer bonded to a second chip in which 3D arrays of NVM cells are formed on a first surface of a second substrate, and may include a scheduler, which is a portion of the control logic circuit controlling the operation conditions of the NVM device, arranged on a second surface, which is a rear surface of the first surface of the second substrate. On the second surface of the second substrate of the second chip, at least one of circuits constituting a memory controller may be arranged, or all of memory controller circuits may be arranged.

While the inventive concept has been particularly shown and described with reference to the embodiments described above, it will be understood that various changes in form and details may be made therein without departing from the spirit and scope of the following claims.

What is claimed is:

1. A non-volatile memory device comprising:
    a first chip comprising a first substrate and a peripheral circuit region including a first control logic circuit configured to control operation modes of the non-volatile memory device, wherein the peripheral circuit region is arranged on a first surface of the first substrate of the first chip; and
    a second chip comprising a second substrate and three-dimensional arrays of non-volatile memory cells, wherein the three-dimensional arrays are arranged on a first surface of the second substrate of the second chip, the second chip being vertically stacked on the first chip so that the first surface of the first substrate faces the first surface of the second substrate,
    wherein a second control logic circuit is configured to control operation conditions of the non-volatile memory device and is arranged on a second surface of the second substrate, the second surface of the second substrate being opposite to the first surface of the second substrate of the second chip, and
    wherein the second control logic circuit is directly formed on a polysilicon layer surface disposed on the second surface of the second substrate.

2. The non-volatile memory device of claim 1,
    wherein the second control logic circuit comprises a scheduler configured to control at least one of voltage levels, time points, and time periods of control signals according to the operation modes of the non-volatile memory device.

3. The non-volatile memory device of claim 1,
    wherein a first bonding metal formed on an uppermost metal layer of the first chip is electrically bonded to a second bonding metal formed on an uppermost metal layer of the second chip.

4. The non-volatile memory device of claim 1,
    wherein at least one of circuits of a memory controller configured to control the non-volatile memory device is arranged on the second surface of the second substrate.

5. A storage device comprising:
    a non-volatile memory device comprising non-volatile memory cells; and
    a memory controller configured to control the non-volatile memory device,
    wherein the non-volatile memory device comprises:
        a first chip comprising a first substrate and a peripheral circuit region including a first control logic circuit configured to control operation modes of the non-volatile memory device, wherein the peripheral circuit region is arranged on a first surface of the first substrate of the first chip; and a second chip comprising a second substrate and three-dimensional arrays of the non-volatile memory cells, wherein the three-dimensional arrays are arranged on a first surface of the second substrate of the second chip, the second chip being vertically stacked on the first chip so that the first surface of the first substrate faces the first surface of the second substrate, wherein the memory controller comprises:
a third chip comprising a third substrate and a control circuit region including first circuits configured to set and change operation conditions for the non-volatile memory device, wherein the control circuit region is arranged on a first surface of the third substrate of the third chip, wherein a second control logic circuit is configured to control the operation conditions of the non-volatile memory device and is arranged on a second surface of the second substrate, the second surface of the second substrate being opposite to the first surface of the second substrate of the second chip, and wherein the second control logic circuit is directly formed on a polysilicon layer surface disposed on the second surface of the second substrate.

6. The storage device of claim 5,
wherein the second chip further comprises second circuits configured to set and change the operation conditions for the non-volatile memory device, wherein the second circuits are arranged on the second surface of the second substrate of the second chip.

7. The storage device of claim 6,
wherein the memory controller further comprises:
a processor configured to control an operation of the memory controller; and
a random access memory comprising an operation memory of the memory controller,
wherein the processor is arranged on the first surface of the third substrate of the third chip, as one of the first circuits, and
wherein the random access memory is arranged on the second surface of the second substrate of the second chip, as one of the second circuits.

8. The storage device of claim 7,
wherein the memory controller further comprises:
a memory management unit configured to change the operation conditions for the non-volatile memory device based on a deterioration status of the non-volatile memory device, and
wherein the memory management unit is arranged on the second surface of the second substrate of the second chip, as one of the second circuits.

9. The storage device of claim 8,
wherein the memory management unit stores deterioration information comprising at least one from among the deterioration status of the non-volatile memory device, a program/erase (P/E) cycle, an erase count, a program count, a read count, a wear level count, an elapse time, and an operation temperature.

10. The storage device of claim 9,
wherein the memory management unit generates training data based on the deterioration information of the non-volatile memory device, and obtains the operation conditions for the non-volatile memory device based on the training data.

11. The storage device of claim 7,
wherein the memory controller further comprises an error correction code (ECC) processing unit configured to detect and correct errors of data transmitted between the non-volatile memory device and the memory controller, and
wherein the ECC processing unit is arranged on the second surface of the second substrate of the second chip, as one of the second circuits.

12. The storage device of claim 5,
wherein the second control logic circuit comprises a scheduler configured to control at least one of voltage levels, time points, and time periods of control signals according to the operation mode of the non-volatile memory device.

13. The storage device of claim 5,
wherein the non-volatile memory device further comprises a first bonding metal formed on an uppermost metal layer of the first chip that is electrically connected to a second bonding metal formed on an uppermost metal layer of the second chip.

14. A storage device comprising:
a non-volatile memory device comprising non-volatile memory cells; and
a memory controller configured to control the non-volatile memory device,
wherein the non-volatile memory device comprises:
a first chip comprising a first substrate and a peripheral circuit region including a first control logic circuit configured to control operation modes of the non-volatile memory device, wherein the peripheral circuit region is arranged on a first surface of the first substrate; and
a second chip comprising a second substrate and three-dimensional arrays of the non-volatile memory cells, wherein the three-dimensional arrays are arranged on a first surface of the second substrate of the second chip, the second chip being vertically stacked on the first chip so that the first surface of the first substrate faces the first surface of the second substrate, wherein a control circuit region comprising at least one of circuits constituting the memory controller is formed on a second surface of the second substrate, the second surface of the second substrate being opposite to the first surface of the second substrate of the second chip, and wherein the control circuit region is directly formed on a polysilicon layer surface disposed on the second surface of the second substrate.

15. The storage device of claim 14,
wherein a second control logic circuit is configured to control operation conditions of the non-volatile memory device and is arranged on the second surface of the second substrate of the second chip.

16. The storage device of claim 15,
wherein the second control logic circuit comprises a scheduler configured to control at least one of voltage levels, time points, and time periods of control signals according to the operation mode of the non-volatile memory device.

17. The storage device of claim 15, further comprising:
a random access memory including an operation memory of the memory controller that is arranged on the second surface of the second substrate of the second chip,
wherein the second control logic circuit accesses the random access memory.

18. The storage device of claim 14, further comprising:
a processor configured to control an operation of the memory controller that is arranged on the second surface of the second substrate of the second chip.

19. The storage device of claim 14, further comprising:
an error correction code (ECC) processing unit configured to detect and correct errors of data related to the non-volatile memory device and is arranged on the second surface of the second substrate of the second chip.

* * * * *